United States Patent [19]

Yates

[11] Patent Number: 5,354,198
[45] Date of Patent: Oct. 11, 1994

[54] MOVABLE CANTILEVERED PURGE SYSTEM

[75] Inventor: Cleon R. Yates, Austin, Tex.

[73] Assignee: Cyrco Twenty-Two, Inc., Austin, Tex.

[21] Appl. No.: 279,844

[22] Filed: Dec. 5, 1988

[51] Int. Cl.$^5$ .......................... F27D 3/06; F27B 9/26
[52] U.S. Cl. ......................................... 432/5; 432/11; 432/152; 432/253
[58] Field of Search ................ 432/5, 6, 11, 152, 253

[56] References Cited

U.S. PATENT DOCUMENTS

| | | | |
|---|---|---|---|
| 4,412,812 | 11/1983 | Sadowski et al. | 432/253 X |
| 4,439,146 | 3/1984 | Sugita | 432/5 X |
| 4,459,104 | 7/1984 | Wollmann | 432/123 |
| 4,518,349 | 5/1985 | Tressler et al. | 432/11 |
| 4,543,059 | 9/1985 | Whang et al. | 432/11 |
| 4,579,523 | 4/1986 | Laiguddin et al. | 432/5 X |
| 4,669,938 | 6/1987 | Hayward | 432/253 X |
| 4,767,251 | 8/1988 | Whang | 432/11 X |
| 4,876,225 | 10/1989 | Wagner et al. | 432/11 X |

Primary Examiner—Harold Joyce
Attorney, Agent, or Firm—Hugh D. Jaeger

[57] ABSTRACT

A movable cantilevered purge system providing for a wafer load position, a wafer purge position, and a wafer process position. The movable cantilevered purge system includes an elephant carrier vehicle for movement of a movable quartz elephant tube. The movable quartz elephant tube includes a purge injector and a return exhaust tube. A cantilevered paddle clamping vehicle moves behind the movable quartz elephant carrier vehicle and holds a silicon carbide or ceramic paddle. The elephant carrier vehicle includes a quartz sealing ring and a stainless steel sealing ring carried on pivotable adjusting blocks, and are supported by a plurality of cylindrical tubes. The quartz sealing ring concentrically positions about the process tube of the furnace and a metal ring positions about a scavenger face. The return exhaust tube connects back into the scavenger area of the furnace.

7 Claims, 11 Drawing Sheets

MOVABLE CANTILEVERED PURGE SYSTEM

CROSS REFERENCES TO CO-PENDING APPLICATIONS

This patent application is related to U.S. Pat. No. 4,979,897, entitled "Atmospheric Door Closure", by Cleon R. Yates, and assigned to the same assignee.

BACKGROUND OF THE INVENTION

1. Field of the Invention

The present invention pertains to semiconductor processing systems, and more particularly, pertains to a movable cantilevered purge system including a movable quartz elephant tube with a paddle for use between a wafer load position, a wafer purge position, and a wafer process position for a substrate processing furnace.

2. Description of the Prior Art

Prior art systems have either provided a wafer load position or a wafer process position, but have not provided for an adequate purging position between the other two positions.

U.S. Pat. No. 4,459,104 to Wollmann, entitled "Cantilevered Diffusion Tube Apparatus and Method"; and U.S. Pat. No. 4,526,534 to Wollmann, entitled "Cantilevered Diffusion Tube Apparatus and Method" each have slots in the bottom of the process tubes.

U.S. Pat. No. 4,543,059 to Whang et al., entitled "Slotted Cantilevered Diffusion Tube System and Method and Apparatus for Loading" describes a diffusion tube apparatus. The reference discloses a large quartz tube with a slot in the bottom. There is one glass sleeve inside the process tube. There are no bellows to support a paddle. The glass sleeve is supported on a single runaway and in close proximity to the process tube.

The present invention overcomes the disadvantages of the prior art by providing a movable elephant tube for use in a wafer load purge and process position, and can include a purge injector and a return exhaust tube in the elephant tube. The moveable elephant tube provides for access to wafer loads and purging of the process tube including accelerated cooling cycles.

SUMMARY OF THE INVENTION

The general purpose of the present invention is to provide a movable cantilevered purge system including the use of a movable quartz elephant tube with sealing ring assembly, which seals a movable quartz elephant tube into a wafer processing furnace and about scavenger faces of the furnace.

According to one embodiment of the present invention, there is provided a movable cantilevered purge system including a movable quartz elephant tube positioned on bearing blocks on stainless steel shafts. A silicon carbide or ceramic paddle is supported in a cantilevered paddle clamping vehicle, also mounted on the stainless steel shafts. The stainless steel shaft assembly is positioned adjacent to a processing furnace and in alignment with a quartz process tube. The movable quartz elephant tube moves between a wafer load position, a wafer purge position, and a wafer processing position. The particular sealing arrangement of the quartz ring to the process tube and the stainless steel ring to the scavenger face, provide for a system in that the rings are provided with three degrees of movement and concentricity between the movable quartz elephant tube, the process tube, and the furnace by the doors.

Significant aspects and features of the present invention include a movable cantilevered purge system with a movable quartz elephant tube which includes a quartz door sealing against a wafer processing tube, and a metal door sealing against the scavenger face where the doors are sealed with concentricity with respect to the tubes. There is also a seal made between the scavenger face and the return exhaust for venting of any gases. This also provides a workable system preventing back-streaming of gases.

Another significant aspect and feature of the present invention is an elephant tube which slides between a wafer load position, a wafer purge position, and a wafer process position. The elephant tube and supporting structure also provides for venting and expedited cooling and/or purging of gases through a return scavenger exhaust tube. Based on the sealing arrangements, there is no, or very minimal, back-streaming of atmospheric gases from the room into the elephant tube.

A further significant aspect and feature of the present invention is a movable cantilevered purge system which provides for an atmospheric controlled environment such as for vapor deposition processes. The atmosphere can also be purged such as with an inert gas.

Having thus described principal embodiments of the present invention, it is a principal object hereof to provide a movable cantilevered purge system including the use of an elephant tube with at least one, preferably two, injector nozzles riding on a track or rail system.

One object of the present invention is a movable elephant tube between various positions and along the shaft of a paddle handle such as a Norton paddle.

Another object of the present invention is an elephant tube assembly which forms an airtight seal about the surrounding structure to prevent the escape of gases and prevent the back-streaming of gases. Depending upon the operational parameters, temperatures and pressures, there may be a very minute amount of gas escaping or back-streaming, but if so, such is very minimal.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
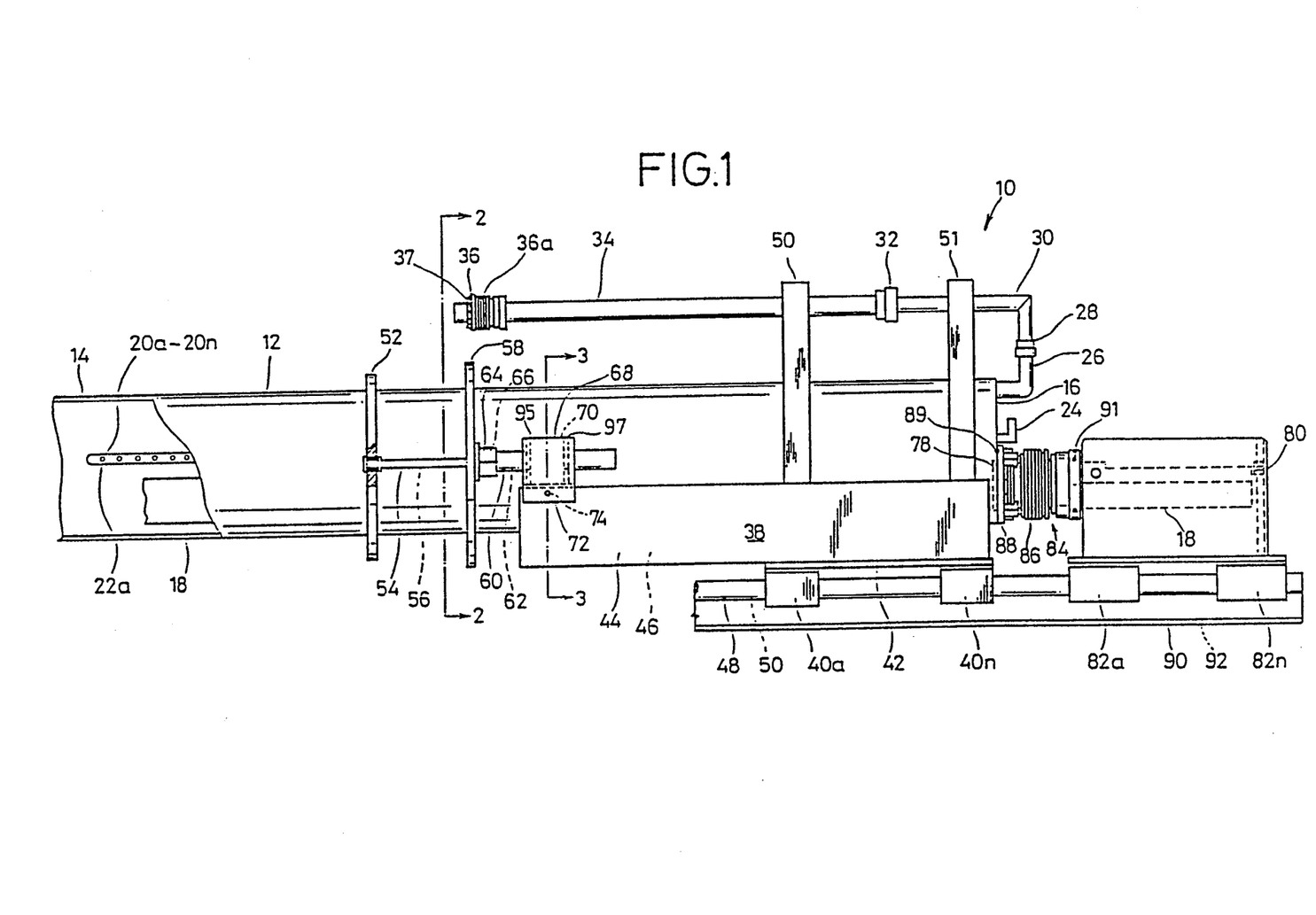
FIG. 1 illustrates a side view of a movable cantilevered purge system, the present invention.
Figure 2:
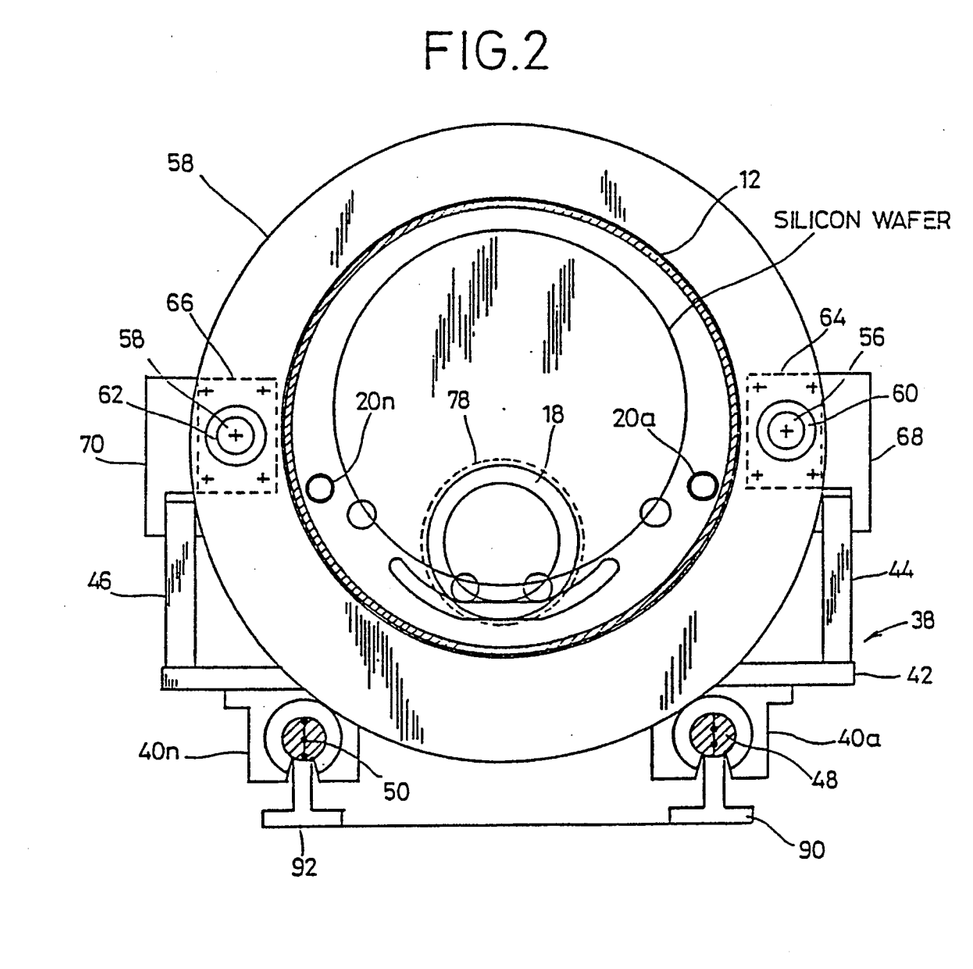
FIG. 2 illustrates an end view in cross section of the movable cantilevered purge system taken along line 2—2 of FIG. 1.
Figure 6:
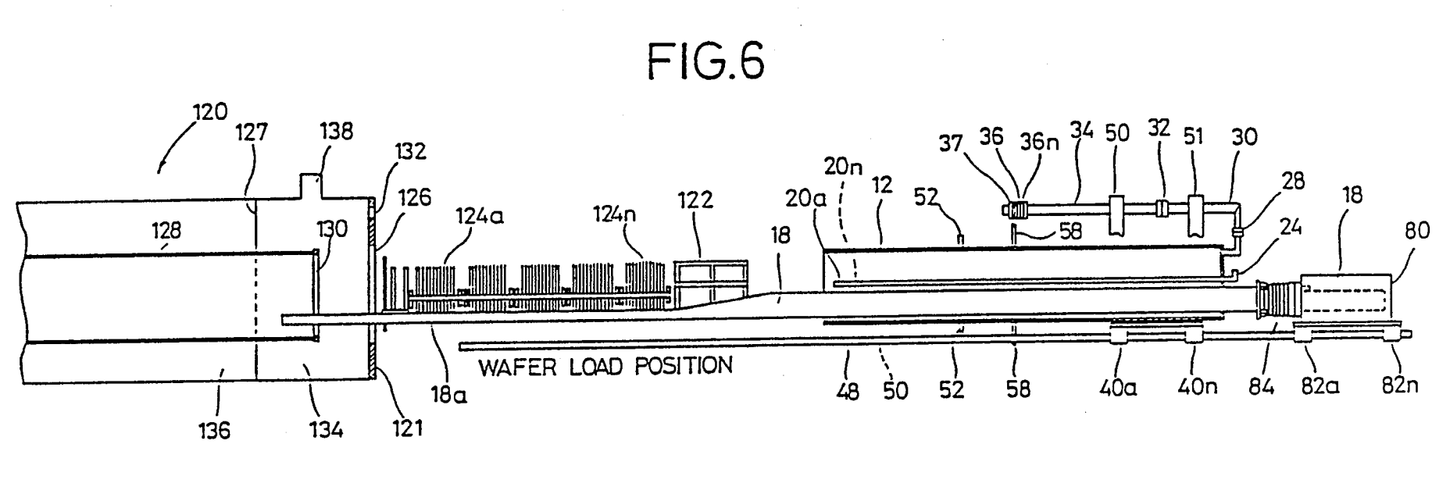
FIG. 6 illustrates the mode of operation of the wafer load position of the movable cantilevered purge system in partial cross section.

FIG. 1 illustrates a side view of a movable cantilevered purge system 10 including a movable quartz elephant tube 12. The movable quartz elephant tube 12 can be of varying diameters and lengths according to specific load requirements and wafer size. The movable quartz elephant tube 12 includes one open end 14, and an opposing end 16 which can be partially closed with an opening in the partially closed end 16 of sufficient size and shape to allow a silicon carbide or ceramic paddle support shaft or handle 18 to pass through the minimal clearance of about 70 thousands of an inch and in a range of 10–100 thousands of an inch. Also, the movable quartz elephant tube 12 can include a plurality of one or more nitrogen purge injectors 20a–20n located and fixed to the inner wall of the movable quartz elephant tube 12 at strategic points so as to pass nitrogen or other gases across wafer surfaces for such purposes as removing oxygen from the atmosphere. The movable quartz elephant tube 12 can also have a plurality of one or more connecting nipples for the purpose of attaching gas passing apparatus structure. A plurality of one or more holes 22a–22n of varying sizes and center-to-center spacings are located in the nitrogen purge injectors 20a–20n for the purpose of passing nitrogen or other gases across the surface of silicon wafers as illustrated in FIG. 2. A quartz exhaust nipple 24 positions on the partially closed end 16 of the movable quartz elephant tube 12 onto which a gas source can be attached. The quartz exhaust nipple 24 connects to the purge injector tubes 20a–20n. A quartz exhaust nipple 26 is constructed of quartz tubing and seals directly to the interior of the movable quartz elephant tube 12 for the purpose of attaching an airtight O'ring compression connector and flange assembly 28. A stainless steel connector elbow 30 connects to the other end of the airtight O'ring compression connector 28 and to airtight O'ring compression connector 32. The stainless steel connector elbow 30 is constructed of stainless steel or other like materials, and provides a vacuum-tight connection between the movable quartz elephant tube 12 via the quartz exhaust nipple 26, the airtight O'ring compression connectors 28 and 32, and a straight section of stainless steel return scavenger exhaust tube 34. This provides the piping for which to route exhaust gases that may exit from the furnace scavenger area. A closure door 36 for the return scavenger exhaust tube 34 is constructed of stainless steel or other like materials, combines a stainless steel flexible joint 36a in cooperation with stainless steel sealing door 58, and attaches to the stainless steel scavenger exhaust tube 34. The closure door 36 provides a substantially airtight sealing between the scavenger face 121 and the stainless steel return scavenger exhaust tube 34 when in the purge or wafer process position. A compression type airtight O'ring 37 positions adjacent to the end of the closure door 36 to subsequently seal over return scavenger exhaust hole 132 of the scavenger face 121 as illustrated in FIG. 6. A quartz sealing door 52 of sufficient inner and outer diameter and thickness is located concentrically over and about the movable quartz elephant tube 12. The quartz sealing door 52 is supported by two or more horizontally aligned quartz slide rods on opposing sides of the elephant carrier vehicle 38, and provides a tight seal between the movable quartz elephant tube 12 and the process tube when the movable quartz elephant tube 12 is in the purge or wafer process position. A stainless steel sealing door 58, constructed of stainless steel or other like material of sufficient inner and outer diameter and thickness, is located concentrically over and about the movable quartz elephant tube 12, is supported by two or more horizontally aligned cylindrical tubes 60 and 62, and provides a seal between the movable quartz elephant tube 12 and external portion of the scavenger exhaust area when the movable quartz elephant tube 12 is in the purge position or wafer process position. Mounting flanges 64 and 66, constructed of stainless steel or other like material, are located concentrically on cylindrical tubes 60 and 62 for the purpose of attaching and securing stainless steel sealing door 58. Pivotal adjusting blocks 68 and 70, made of stainless steel or other like material, are located and attached to opposing sides of the elephant carrier vehicle 38, and provide support means for the quartz slide rods 54 and 56 and cylindrical tubes 60 and 62 while offering both vertical and angular pivotal adjustments to the quartz sealing door 52 and the stainless steel scavenger sealing door 58. The cylindrical tubes 60 and 62, made of stainless steel or other like material, are located and attached to the pivotal adjusting blocks 68 and 70, have one end open and the other end closed providing an enclosed housing for stainless steel springs, and one or more Teflon concentric cylindrical spacers. Teflon spacers maintain concentricity between quartz slide rods 54 and 56 and cylindrical tubes 60 and 62, respectively, and also provide slidability when the quartz sealing door 52 concentrically contacts the process tube during the purge or wafer process cycles. The stainless steel springs allow flexibility of quartz slide rods 54 and 56, assuring proper engagement and tension of quartz sealing door 52 during the purge or wafer process cycles. Pivotal pins 72 and 74 provide axis to pivotal adjusting blocks 68 and 70 located on opposing sides of the elephant carrier vehicle 38 and above opposing sides of the movable quartz elephant tube 12 when adjustments are made so as to achieve concentricity between quartz sealing door 52 and movable quartz elephant tube 12, the stainless steel sealing door 58, and movable quartz elephant tube 12. Reference to the quartz sealing doors, quartz slide rods, cylindrical tubes, stainless steel springs, Teflon spacers and the pivot blocks is made in a co-pending U.S. Pat. No. 4,979,897, entitled "Atmospheric Door Closure" by the same inventor and assigned to the same assignee. A paddle hole 78 is located in partially closed end 16 of movable quartz elephant tube 12 and provides a passageway through which the silicon carbide paddle support shaft 18 passes. The size and configuration of partially closed end 16 varies according to the particular silicon carbide paddle size. A cantilevered paddle clamping vehicle 80 is constructed of aluminum which can be hard stainless steel or other like materials, and is supported by a plurality of one or more bearing blocks 82a–82n which provides smooth travel on the parallel stainless steel shafts 48 and 50. The cantilevered paddle clamping vehicle 80 secures and supports the silicon carbide paddle support shaft 18. The cantilevered paddle clamping vehicle 80 also provides for alignment of the paddle with respect to the process tube and other components. The cantilevered paddle clamping vehicle 80 also provides adjustments, both vertical and lateral, to the silicon carbide paddle support shaft 18 assuring alignment between the silicon carbide paddle support shaft 18, the movable quartz elephant tube 12 and process tube as previously referenced in the co-pending patent application. A closure door 84 for the movable quartz elephant tube 12 is constructed of stainless steel or other like materials, and attaches directly to silicon carbide paddle support shaft 18 via a compression type airtight O'ring type seal 91 of suitable material. The closure door 84 is comprised of stainless steel flexible bellows 86 attached to a sealing plate 88 which may have an optional compression type airtight O'ring 89 of a suitable material, which engages with end 16 of the movable quartz elephant tube 12, and assures a substantially airtight sealing between the silicon carbide paddle support shaft 18 and the movable quartz elephant tube 12 when in the purge or the wafer process position. Shaft supports 90 and 92, constructed of stainless steel or other like materials, provide structure for securing and supporting the stainless steel shafts 48 and 50 so that the bearing blocks 40a–40n and 82a–82n can ride smoothly along the shaft supports 90 and 92. An O'ring 89 seals the sealing plate 88 and the elephant tube end 16. Another O'ring 91 seals the closure door 84 about the silicon carbide paddle support shaft 18.

FIG. 2 illustrates an end view in cross section of the movable cantilevered purge system 10 taken along line 2—2 of FIG. 1 where all numerals correspond to those elements previously described. Shown in particular is the stainless steel sealing door 58 concentric to and over and about the movable quartz elephant tube 12. The plurality of purge injectors 20a–20n are located as to provide for desired purging across substrate fronts, by way of example, of the inner side wall of the movable quartz elephant tube 12. Additional numbers of purge injectors 20a–20n can also be incorporated into the system. The purge injectors 20a–20n can be placed at other positions on the inner side walls than the positions illustrated, and can be manifolded together as illustrated in FIG. 4.

Figure 3:
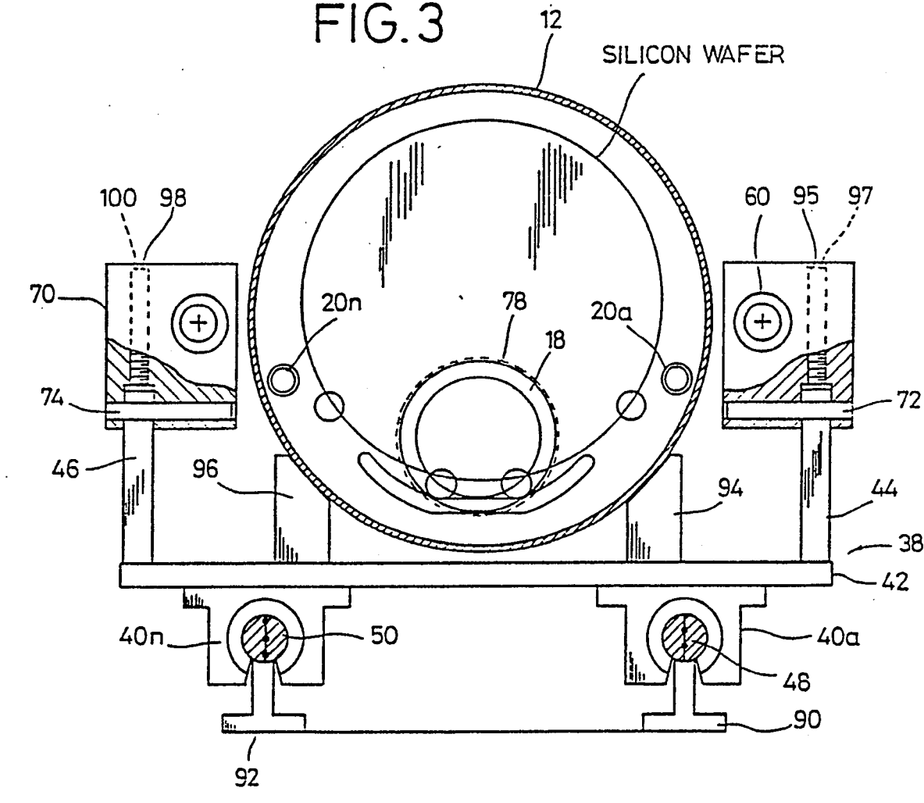
FIG. 3 illustrates an end view in cross section of the movable cantilevered purge system taken along line 3—3 of FIG. 1.

FIG. 3 illustrates an end view in cross section of the movable cantilevered purge system 10 taken along line 3—3 of FIG. 1 where all numerals correspond to those elements previously described. Longitudinal support members 94 and 96 extend vertically from the mounting plate 42 of the elephant carrier vehicle 38 to support the sides of the movable quartz elephant tube 12. The elephant carrier vehicle 38, including the movable quartz elephant tube 12, traverses on the plurality of bearing blocks 40a–40n and along the shafts 48 and 50. Shafts 48 and 50 are supported along the top portion of the shaft supports 90 and 92.

Pivotal pins 72 and 74 are illustrated in the pivotal adjusting blocks 68 and 70. Adjustment screws 95 and 97 in the pivotal adjusting block 68 and adjustment screws 98 and 100 in the pivotal adjusting block 70, as also illustrated partially in FIG. 1, adjust to pivot the pivotal adjusting blocks 68 and 70 about the pivotal pins 72 and 74 so as to horizontally align the cylindrical tubes 60 and 62, the quartz slide rods 54 and 56 and stainless steel and quartz sealing doors 58 and 52. The sealing doors 52 and 58 act as concentric doors against the process tube and the scavenger face.

Figure 4:
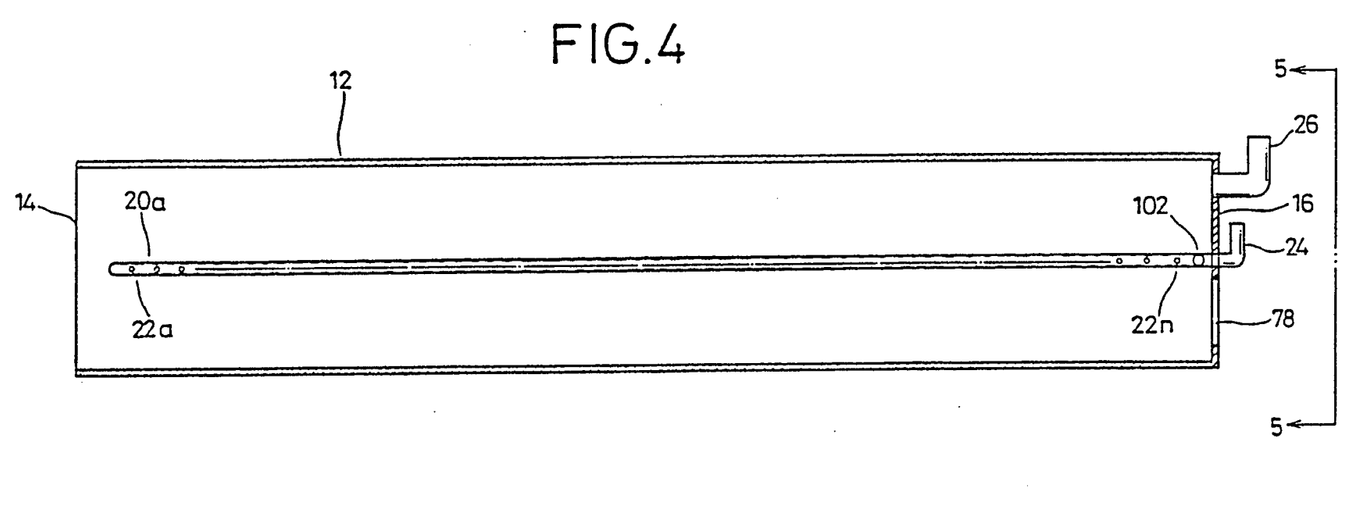
FIG. 4 illustrates a vertical cross section of a movable quartz elephant tube.

FIG. 4 illustrates a vertical cross section of the movable quartz elephant tube 12 where all numerals correspond to those elements previously described. Illustrated in particular is one of the purge injectors 20a secured to the inner wall of the movable quartz elephant tube 12. A manifold 102 connects the ends of the purge injector tubes 20a–20n adjacent to hole 22n of each injector tube as further illustrated in FIG. 5.

Figure 5:
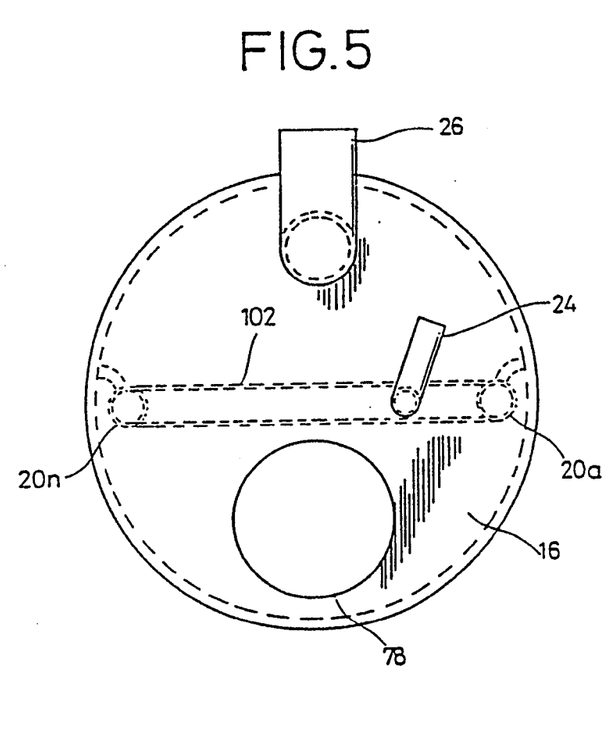
FIG. 5 illustrates an end view of the movable quartz elephant tube.

FIG. 5 illustrates an end view of the movable quartz elephant tube 12 along line 5—5 of FIG. 5 where all numerals correspond to those elements previously described. Manifold 102 is illustrated across the interior of the movable quartz elephant tube 12 connecting the nitrogen purge injectors 20a and 20n.

MODE OF OPERATION

Figure 7:
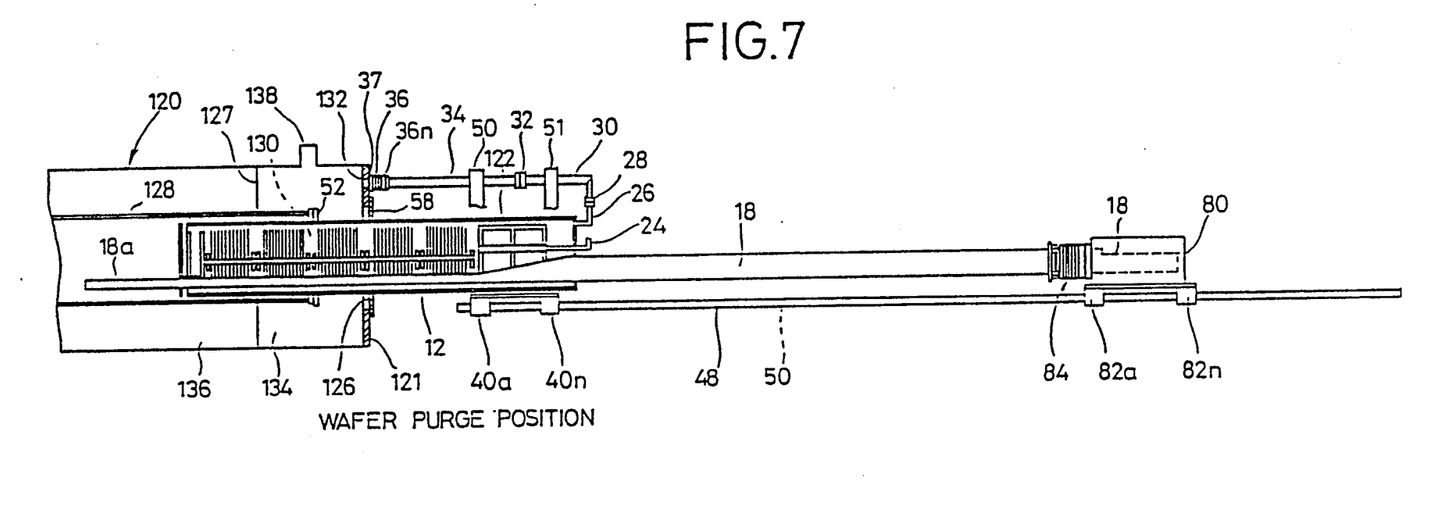
FIG. 7 illustrates the mode of operation of the wafer purge position.
Figure 8:
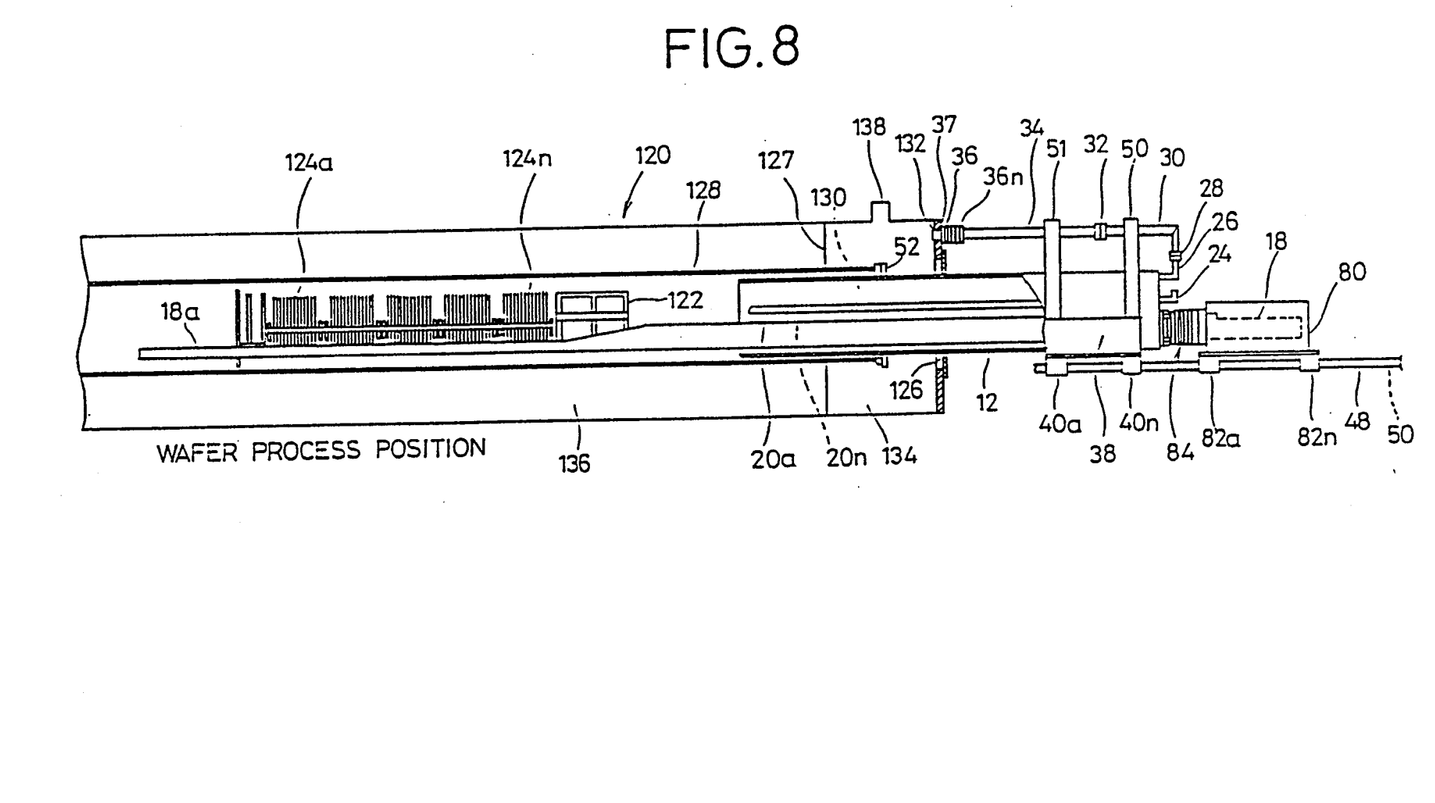
FIG. 8 illustrates the mode of operation of the wafer process position.

FIG. 6-8 best illustrate the mode of operation of the movable cantilevered purge system in conjunction with a wafer processing furnace.

FIG. 6 illustrates the movable cantilevered purge system 10 in partial cross section adjacent to a wafer processing furnace 120 in the wafer load position. All numerals correspond to those elements previously described. A wafer load zone 18a of the paddle extends from a midpoint of the paddle to one end of the silicon carbide paddle support shaft 18. A wafer boat 122, ready for processing, contains a plurality of wafers 124a–124n residing on the loading zone 18a and is illustrated prior to processing. The wafer processing furnace 120 includes a scavenger face 121, a scavenger hole 126 in the scavenger face 121, a quartz process tube 128 and a process tube orifice 130. A scavenger wall 127 in the wafer processing furnace 120 separates the scavenger area 134 from the process area 136 within the process furnace 120. The diameter of the scavenger hole 126 is of a larger dimension than the diameter of the process tube orifice 130 to allow passage of the quartz sealing door 52 through the scavenger hole 126 to subsequently seal against the process tube orifice 130. The scavenger hole 126 aligns axially with and subsequently seals against the stainless steel seal door 58. In a like manner, the process tube orifice 130 aligns axially with and subsequently seals against the quartz sealing door 52. A return scavenger exhaust hole 132 in the scavenger face 121 of the wafer processing furnace 120 aligns with the return scavenger exhaust tube 34, the closure door 36 and flexible joint 36a. The return scavenger exhaust hole 132 can be optionally added to the scavenger hole 126. A scavenger exhaust hole 138 is located on the wafer processing furnace 120 adjacent to the scavenger area 134.

FIG. 7 illustrates the wafer purge position where all numerals correspond to those elements previously described. The elephant carrier vehicle 38, illustrated in FIG. 1, and the cantilevered paddle clamping vehicle 80 slidingly position along the stainless steel shafts 48 and 50 in a coordinated fashion so that the movable quartz elephant tube 12 and associated members are positioned partially within and seal against the wafer processing furnace 120 and the quartz process tube 128 for purging. As previously described, the wafer processing furnace 120 is sealed by the mating and engagement of the stainless steel sealing door 58 with the furnace scavenger face 121. The quartz process tube 128 is sealed by the mating and engagement of the quartz sealing door 52 with the process tube orifice 130. The closure door 36, including the flexible joint 36a, seals the return scavenger exhaust tube 34 projecting through the return scavenger exhaust hole 132 and thus with the furnace scavenger area 134 of the wafer processing furnace 120. The quartz sealing door 52 and the stainless steel sealing door 58 seal in a sequenced manner to seal the movable quartz elephant tube 12 to the scavenger face 121 and the quartz process tube 128. Initially, the spring cushioned quartz sealing door 52 mates with process tube orifice 130 of the process tube 128 and compresses internal springs in the pivotal adjusting blocks 68 and 70. Subsequently, the stainless steel sealing door 58 positions against the scavenger face 121 of the wafer processing furnace 120 as the elephant carrier vehicle 38, illustrated in FIG. 1, is moved further to the left. Pressurized nitrogen or other gas is introduced into the quartz exhaust nipple 24, and enters the interior of the sealed movable quartz elephant tube 12 through the purge injectors 20a–20n illustrated in FIGS. 1, 2, 4 and 5. Spent gases are purged from the sealed movable quartz elephant tube 12 through the quartz exhaust nipple 26, through the airtight O'ring compression connector 28, the stainless steel connecter elbow 30, the airtight O'ring compression connector 32, and through the return scavenger exhaust tube 34 into the furnace process area 136 of the wafer processing furnace 120.

FIG. 8 illustrates the wafer processing position where all numerals correspond to those elements previously described. After purging of the movable quartz elephant tube 12, the cantilevered paddle clamping vehicle 80 is further positioned to the left and toward the elephant carrier vehicle 38 to position the wafer loading zone 18a containing the wafers 124a–124n fully into the interior of the quartz process tube 128 for wafer processing. The elephant carrier vehicle 38 and its associated components remain stationary as the silicon carbide paddle support shaft 18 passes to the left through the paddle hole 78 illustrated in FIG. 2.

After processing of the wafers 124a–124n in the quartz process tube 128, the wafer loading zone 18a and the movable quartz elephant tube 12 are withdrawn in reverse order from the quartz process tube 128 and the wafer processing furnace 120 by the sequenced movement of the elephant carrier vehicle 38 and the cantilevered paddle clamping vehicle 80 along the parallel stainless steel shafts 48 and 50.

Figure 9:
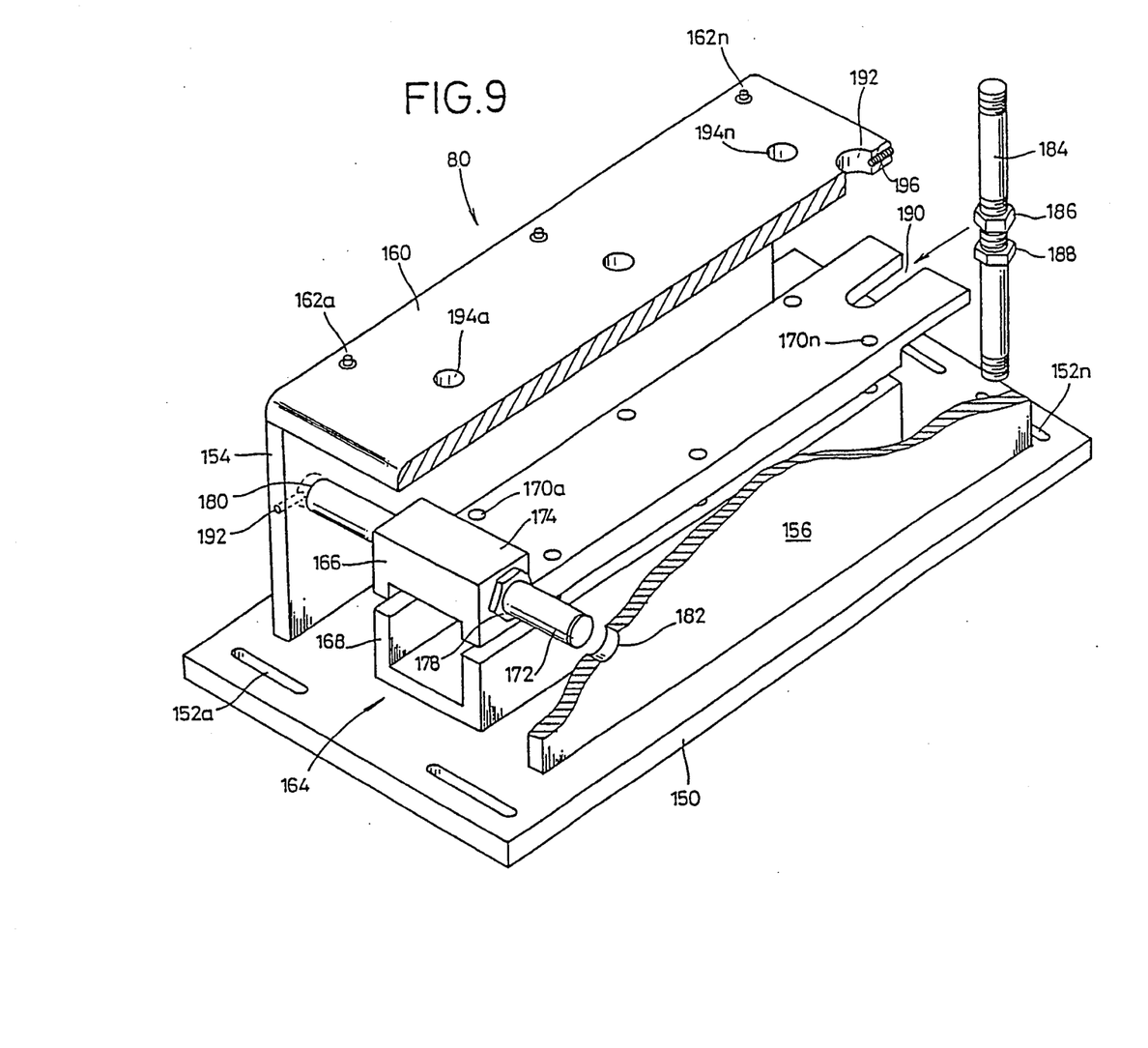
FIG. 9 illustrates a perspective view of the cantilevered paddle clamping vehicle.
Figure 10:
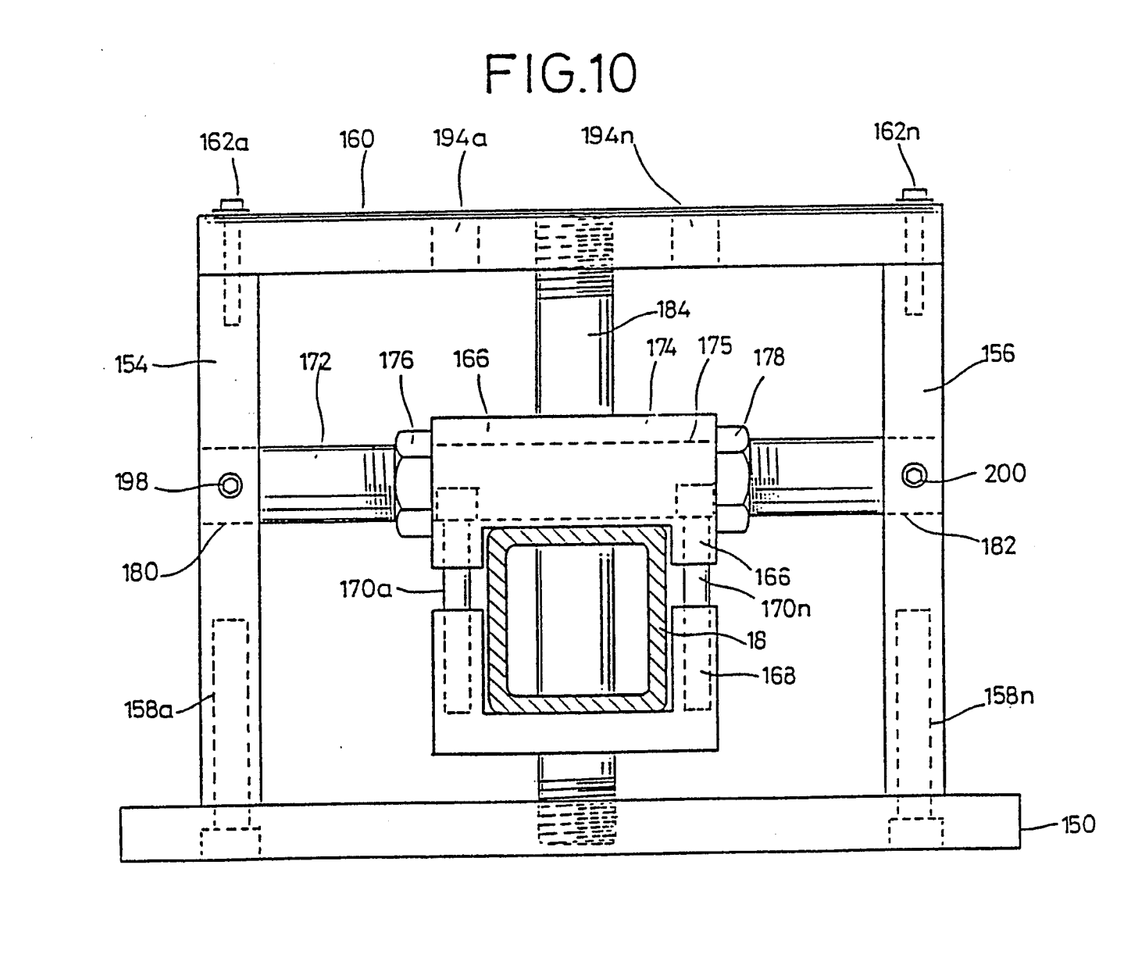
FIG. 10 illustrates an end view of the cantilevered paddle clamping vehicle; and, FIG. 11 illustrates a cross-sectional view of the cantilevered paddle clamping vehicle.
Figure 11:
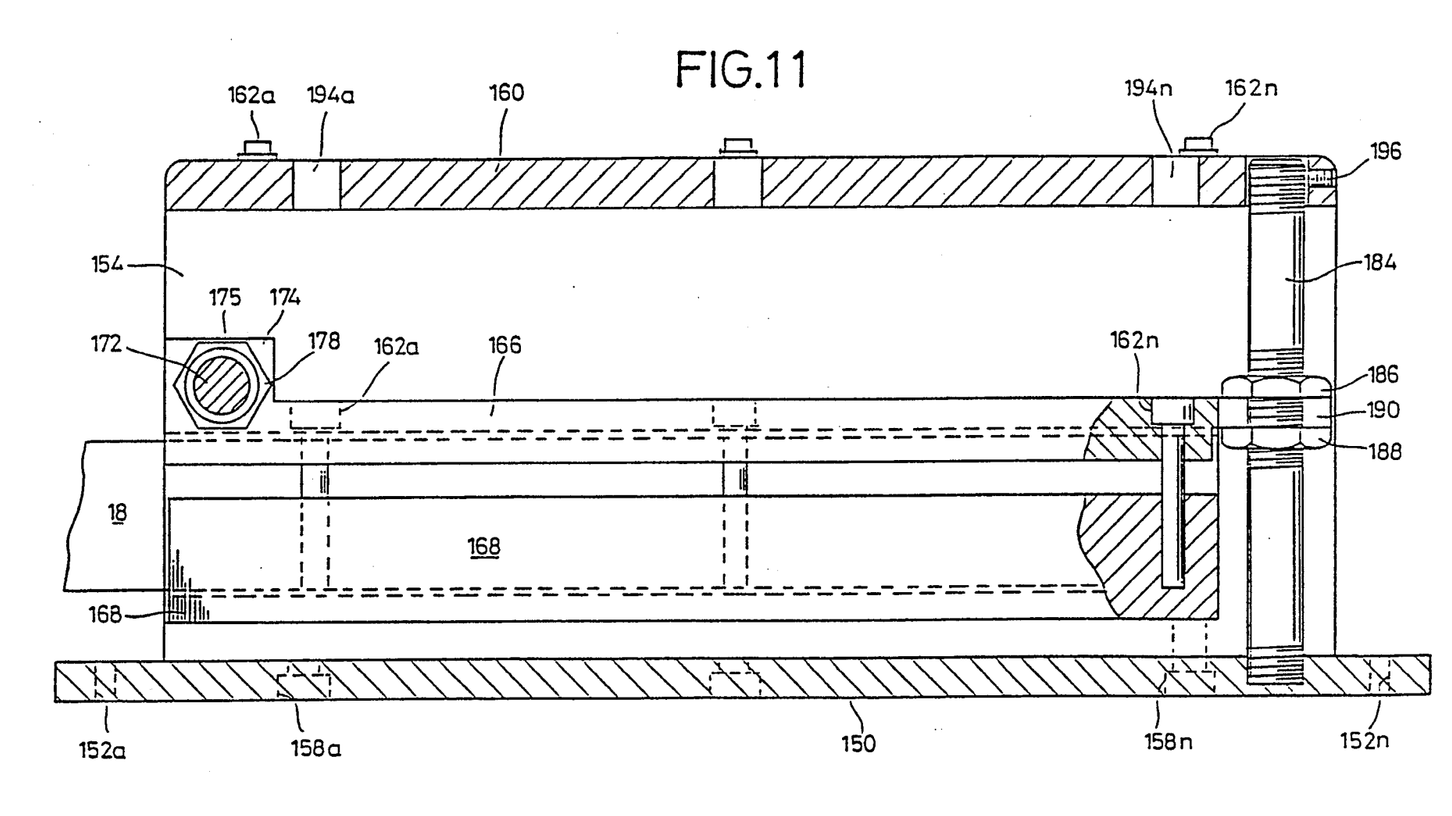

FIG. 9 illustrates a perspective view of the cantilevered paddle clamping vehicle 80 where all numerals correspond to those elements previously described. A rectangular base plate 150 includes a plurality of slotted adjustment holes 152a–152n and secures to the bearing blocks 82a–82n of FIG. 1 by appropriate machine screw fasteners through the slotted adjustment holes 152a–152n. Parallel vertical side members 154 and 156 extend perpendicularly from the base plate 150 and are secured thereto by fasteners 158a–158n as illustrated in FIG. 10. A top plate 160 is secured to the vertical side member 154 and 156 by a plurality of fasteners 162a–162n. A pivoting clamp assembly 164 includes an upper channeled clamp member 166 and a lower channeled clamp member 168. The upper and lower channeled clamp members 166 and 168 are aligned with their channeled sides facing each other and are secured together over the silicon carbide paddle support shaft 18 by a plurality of fasteners 170a–170n as illustrated in FIG. 10. A pivotal shaft 172 secures through a hole 175 in a raised rectangular solid member 174 of the upper channeled clamp member 166 and is adjusted and secured thereto by jam nuts 176 and 178 illustrated in FIG. 10. The pivotal shaft 172 aligns in and pivots within holes 180 and 182 in side members 154 and 156. A vertically aligned threaded adjustment rod 184, including jam nuts 186 and 188, aligns in an open slotted hole 190 in one end of the upper channeled clamp member 166 and also aligns in a hole 192 in the top plate 160 as also illustrated in FIG. 11. A plurality of access holes 194a–194n align with the fasteners 170a–170n as illustrated in FIG. 11 to provide tool access to the fasteners 170a–170n so that upper and lower channeled clamp members 166 and 168 may be tightened over and about the silicon carbide paddle support shaft 18. A set screw 196 aligns horizontally with hole 192 in the top plate 160 to secure the upper end of the adjustment rod 184 within the hole 192. Lateral adjustment of the upper and lower channeled clamp members 166 and 168 with a silicon carbide paddle support shaft 18 secured therein is made by adjusting jam nuts 176 and 178 horizontally along the pivotal shaft 172 and against the sides of the raised rectangular solid member 174. Vertical elevational adjustment of the silicon carbide paddle support shaft 18 is provided by adjusting jam nuts 186 and 188 vertically along the adjustment rod 184 to cause the pivoting clamp assembly 164, including the upper and lower channeled clamp members 166 and 168 and the contained silicon carbide paddle support shaft 18 to pivot about the pivotal shaft 172. Upon attaining proper lateral and vertical elevational alignment of the silicon carbide paddle support shaft 18, set screw 196 is tightened against the upper portion of the adjustment rod 184, and the pivotal shaft 172 is secured in position by set screws 198 and 200 aligned horizontally in side members 154 and 156. Set screws 198 and 200 tighten perpendicularly against the end of the pivotal shaft 172 in holes 180 and 182.

FIG. 10 illustrates an end view of the cantilevered paddle clamping vehicle 80 clamped over the silicon carbide paddle support shaft 18. All numerals correspond to those elements previously described. Illustrated in particular are the jam nuts 176 and 178 which laterally position the pivoting clamp assembly 164.

FIG. 11 illustrates a side view in cross section of cantilevered paddle clamping vehicle 80. Illustrated in particular are the jam nuts 186 and 188 which elevationally position the pivoting clamp assembly 164 and the engaged silicon carbide paddle support shaft 18.

Various modifications can be made to the present invention without departing from the apparent scope hereof.

I claim:

1. Elephant tube for processing of substrates for positioning between a substrate processing furnace and a cantilevered paddle clamping vehicle comprising:
   a. a movable quartz elephant tube;
   b. gas purge injector means positioned within said elephant tube;
   c. a first sealing door means for engaging against a substrate processing tube; and,
   d. a second door means for engaging against said substrate processing furnace, whereby said first door means is supported on biased members and said second door means is fixedly secured about said elephant tube.

2. The elephant tube of claim 1 wherein atmospheric nitrogen is connected to said gas purge injector means.

3. An elephant tube assembly for use in the processing of a plurality of semiconductor wafers or other substrates in a furnace comprising:
   a. a quartz tube;
   b. gas injector means positioned within said quartz tube;
   c. gas exhaust means including one end portion thereof communicating with the interior of the quartz tube and another end portion thereof for removable communication with the interior of the furnace;
   d. a first means carried by the quartz tube for sealing engagement around an aperture in a process tube;
   e. a second means carried by the quartz tube for sealing engagement around said aperture in the furnace;
   f. said first means having bias means for sealing engagement with said process tube and said furnace; and,
   g. a vehicle to support the elephant tube and to move said elephant tube between load and process positions, and a purge position.

4. The elephant tube of claim 3 including at least one atmospheric inert gas purge means positioned longitudinally in said elephant tube.

5. Substrate transport system comprising:
   a. frame means and opposing rail means supported on said frame means;
   b. paddle vehicle including means for travel on said rail means and a cantilevered paddle for supporting at least one substrate carrier;
   c. door-bellow means secured to a forward end of said paddle vehicle;
   d. elephant tube vehicle including means for travel on said rail means, and a quartz elephant tube secured to said vehicle means, said elephant tube including a hole in a rear end for accepting a handle of said paddle; and,
   e. spring loaded quartz sealing plate biased about an adjustable stainless steel scavenger closure about a mid-portion of said elephant tube and affixed adjacent one end of said elephant tube.

6. In combination, a semiconductor process tube and a substrate processing system comprising:
   a. a semiconductor process tube means for processing a plurality of substrates or wafers in a gaseous environment; and,
   b. substrate processing system including frame means and opposing rail means supported on said frame means, paddle vehicle including means for travel on said rail means, and a cantilevered paddle for supporting at least one substrate carrier, door-bellow means secured to a forward end of said paddle vehicle, elephant tube vehicle including means for travel on said rail means, and an elephant tube secured to said vehicle means, said elephant tube including a hole in a rear end for accepting a handle of said paddle, and spring-biased sealing plate and door means secured at one end to a mid-portion of said elephant tube.

7. Combination of claim 6 wherein said system is for atmospheric nitrogen purge.

* * * * *